(12) United States Patent
Shearon et al.

(10) Patent No.: US 6,351,158 B1
(45) Date of Patent: Feb. 26, 2002

(54) FLOATING GATE CIRCUIT FOR BACKWARDS DRIVEN MOS OUTPUT DRIVER

(75) Inventors: William B. Shearon, Findlay; Peter G. Klein, Mount Cory, both of OH (US); Paul J. Graves, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/569,894

(22) Filed: May 12, 2000

Related U.S. Application Data

(63) Continuation-in-part of application No. 09/442,291, filed on Nov. 19, 1999.

(51) Int. Cl.[7] .................................................. H03B 1/00
(52) U.S. Cl. ........................ 327/108; 327/379; 327/381; 326/22; 326/80
(58) Field of Search ................................. 327/108, 109, 327/112, 379, 380, 381, 384; 326/22, 23, 24, 80, 81, 82, 84, 85–87

(56) References Cited

U.S. PATENT DOCUMENTS

| | | | | |
|---|---|---|---|---|
| 4,972,100 A | * | 11/1990 | Lim et al. ...................... | 326/83 |
| 5,041,746 A | * | 8/1991 | Webster et al. ................ | 327/51 |
| 5,149,991 A | * | 9/1992 | Rogers ......................... | 326/58 |
| 5,160,855 A | * | 11/1992 | Dobberpuhl .................. | 326/58 |
| 5,319,252 A | * | 6/1994 | Pierrce et al. ............... | 327/384 |
| 5,850,153 A | * | 12/1998 | Harris et al. .................. | 326/58 |

* cited by examiner

Primary Examiner—Timothy P. Callahan
Assistant Examiner—An T. Luu
(74) Attorney, Agent, or Firm—Jaeckle Fleischmann & Mugel, LLP

(57) ABSTRACT

A bus driver circuit has floating gate circuits with three transistors. Two of the transistors for an inverter for operating the output power transistor. The third transistor is connected to receive control signals from well pull circuits. The control signal keeps the third transistor off when the bus driver circuit is not enabled.

6 Claims, 5 Drawing Sheets

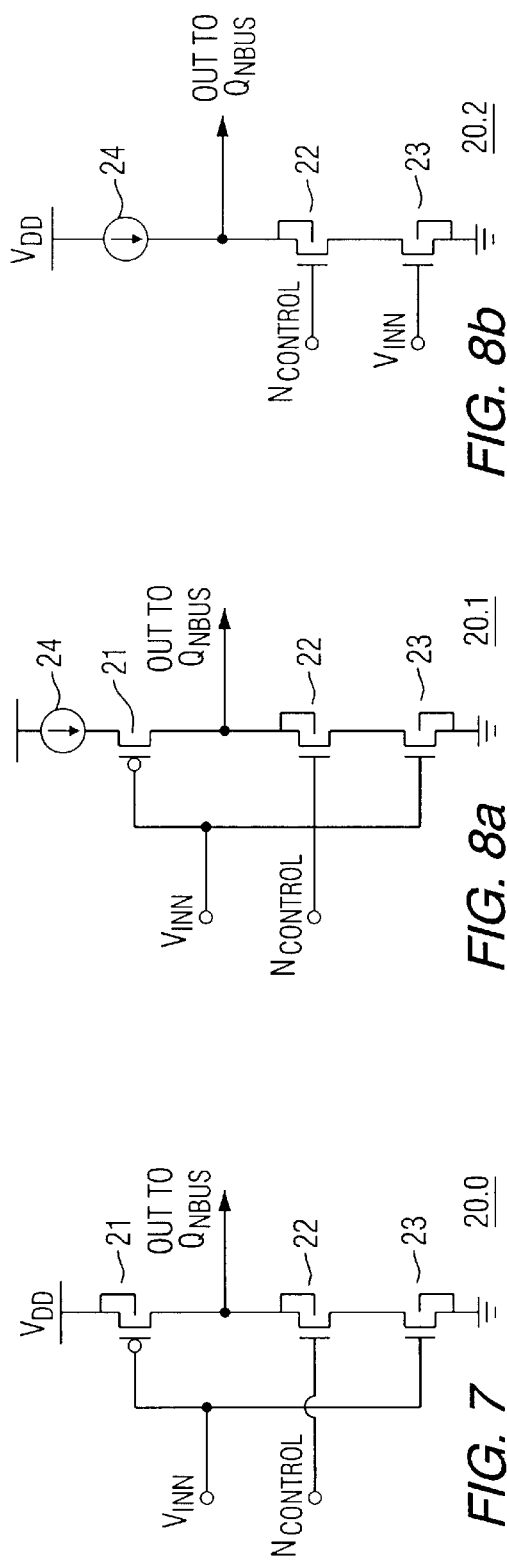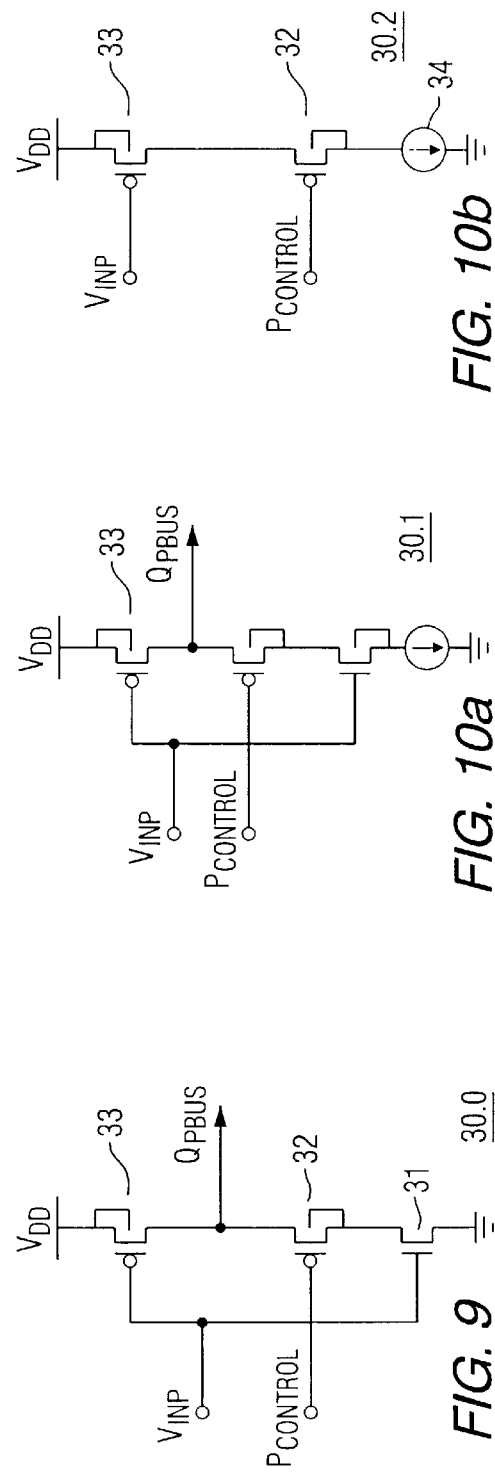

FLOATING GATE CIRCUIT FOR BACKWARDS DRIVEN MOS OUTPUT DRIVER

CROSS-REFERENCE TO RELATED APPLICATIONS

This is a continuation in part of U.S. patent application, Ser. No. 09/442,291, filed Nov. 19, 1999 and assigned to the same assignee as this invention, the entire disclosure of which is incorporated into this patent by reference.

BACKGROUND OF THE INVENTION

This invention relates generally to an apparatus and method for operating an integrated circuit. In particular, it relates to a MOS output driver that is powered by a 3.3v power supply and may be occasionally connected to a higher supply, such as 5v or more.

Complementary metal oxide semiconductors (CMOS) are ubiquitous in integrated circuits and systems. CMOS technology continues to shrink and as it shrinks the power supplies that operate the CMOS devices shrink accordingly. At present, many CMOS devices operate with a 3.3v power supply. However, these devices are often connected to peripheral devices in a system or even on the same chip that may operate or otherwise carry a higher voltage, such as 5v. If an output driver on a circuit is connected to a power supply that is greater than the output driver's normal power supply, the greater power supply may inadvertently turn on the driver when the system requires that the driver be off or otherwise in a quiescent or high-impedance state.

As explained later, others have provided solutions to this problem by controlling the voltage on the gate of the driving transistor, as well as controlling the voltage on the well of the driving transistor. If either of those voltages are not properly controlled, then one or more of the two body diodes in the drive transistor may turn on or the mosfet may itself turn on. See, in particular, U.S. Pat. No. 5,160,855 which shows a well voltage control circuit for controlling the voltage on the well of the drive transistor. The well voltage control circuit includes at least four transistors. However, I have found that the well control circuit does not adequately control the output transistor body when the output voltage is close to the value of the supply voltage during transmission.

The co-pending application discloses, inter alia, a novel well pull up circuit that operates with a conventional floating gate circuit. Experience has shown that conventional floating gate circuits have major limitations. For one, that often fail to timely turn off the output driver mosfets that drive the bus. This invention overcomes the deficiencies of the prior art circuit and provides a new floating gate circuit that is less complex and more reliable than conventional floating gate circuits.

SUMMARY OF THE INVENTION

The invention provides a bus driver that is less complex than the prior art and solves the problem of a floating gate voltage and a floating well voltage where output voltage is close to the value of the supply voltage during transmission. The invention provides a first output driver MOS transistor that has a source, an insulated gate, a body and a drain. This structure includes two inherent diodes. The drain and the body form one diode and the body and the source form the other. A low voltage supply terminal is connected to the source of the MOS transistor and the drain provides the output terminal. The gate terminal receives a gate voltage signal that turns the bus driver MOS transistor on or off. A floating gate control circuit is coupled to the gate and allows the gate to rise (in the case of the P-side driver) with the output voltage on the drain when the output voltage on the drain exceeds the primary supply voltage. This ensures that the normal mosfet conduction does not occur. The floating gate circuits also speed up turn off of the drive transistors and prevent leakage current that would backwards drive the driver circuit. The floating gate circuits included three transistors. Two are configured as an inverter circuit. The third transistor is connected between the two that form the inverter circuit. The third transistor has its well connected to its drain. It is on when the driver circuit is enabled and it discharges the gate of the driver transistor that is turning off. When the driver circuit is not enabled, the third transistor is always off and cannot be turned on. A well pull up circuit is connected to the floating gate control circuit, the body of the MOS transistor and to the primary supply terminal. The well pull up circuit lets the well float and thereby prevents its inadvertent operation of turning on one of the body diodes of the MOS transistor. An enable control circuit controls the well pull up circuit. The enable control circuit drives a high signal (in the case of the N-side driver circuit) during operation of the bus output driver and low when the bus is quiescent or high-impedance.

DRAWINGS

FIG. 1*a* is a schematic of a single bus driver transistor.

FIG. 1*b* is a schematic corresponding to 1*a* and shows the two inherent body diodes.

FIG. 7 is a schematic of one embodiment of a floating gate circuit for a NMOS driver transistor.

FIGS. 8*a* and 8*b* are schematic diagrams of other embodiments of a floating gate circuit for a NMOS driver transistor.

FIG. 9 is a schematic of one embodiment of a floating gate circuit for a PMOS driver transistor.

FIGS. 10*a* and 10*b* are schematic diagrams of other embodiments of a floating gate circuit for a PMOS driver transistor.

Figure 11:
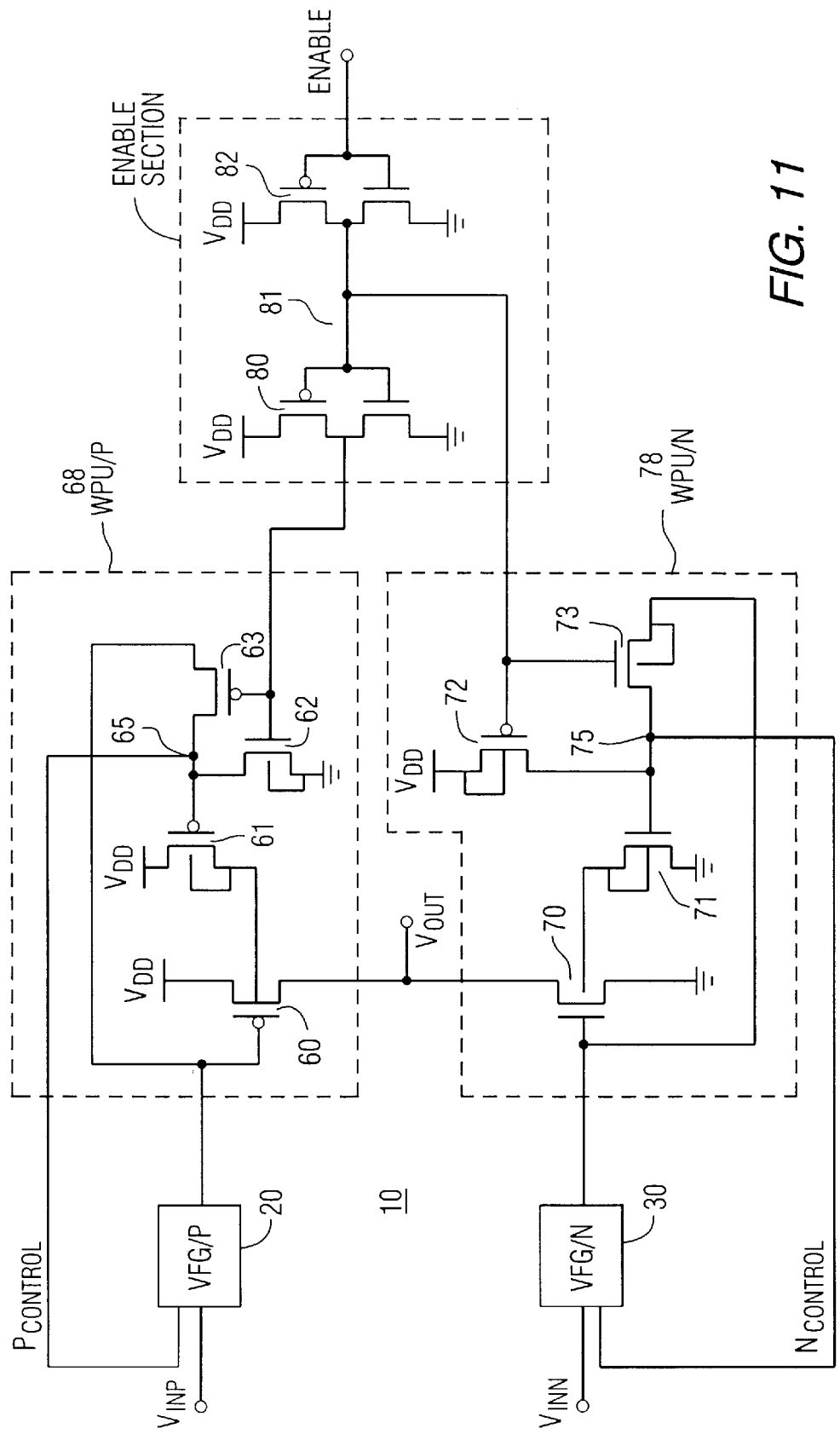

FIG. 11 is schematic of a full driver circuit with floating gate circuits for the NMOS and PMOS drivers.

DETAILED DESCRIPTION

Figure 1A:
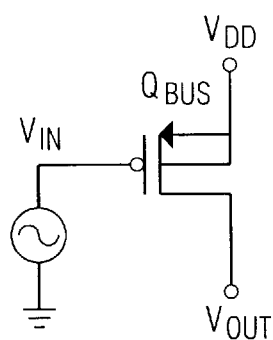
Figure 1B:
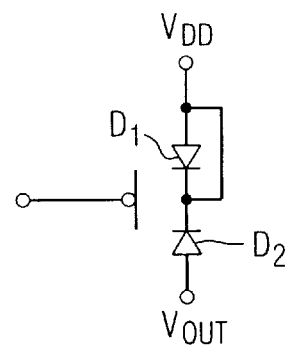

FIGS. 1*a*, 1*b*, 2 and 3 show the problem faced by bus drivers and how the problem is addressed by the circuit disclosed in U.S. Pat. No. 5,160,855. FIG. 1*a* is a simplified version of a bus driver. The driving transistor $Q_{BUS}$ receives an input signal $V_{IN}$. $Q_{BUS}$ is connected between a power supply $V_{DD}$ and an output terminal $V_{OUT}$. The transistor $Q_{BUS}$ is shown as a PMOS transistor. A PMOS transistor includes P-type diffusions in the surface of a substrate that substantially comprises N-type doping. As a result, the transistor QBus has or can be viewed as a structure with two internal diodes such as shown in FIG. 1*b*. Since the source is coupled to the body, one diode is, in effect, shorted to the drain. The other diode is controlled by $V_{OUT}$. It is important that these diodes that are formed by the respective P-type diffusions and the body of the $Q_{BUS}$ be kept from triggering on. If $V_{OUT}$ exceeds $V_{DD}$, the body diode $D_2$ will be turned on. This is undesirable since, in effect, $Q_{BUS}$ could be turned on at a time when $V_{IN}$ was high. In the ideal bus driver, $Q_{BUS}$ never turns on until $V_{IN}$ is low. Those skilled in the art will appreciate that, in a CMOS device, the output circuit of FIG. 1a will have a corresponding NMOS output transistor.

Figure 2:
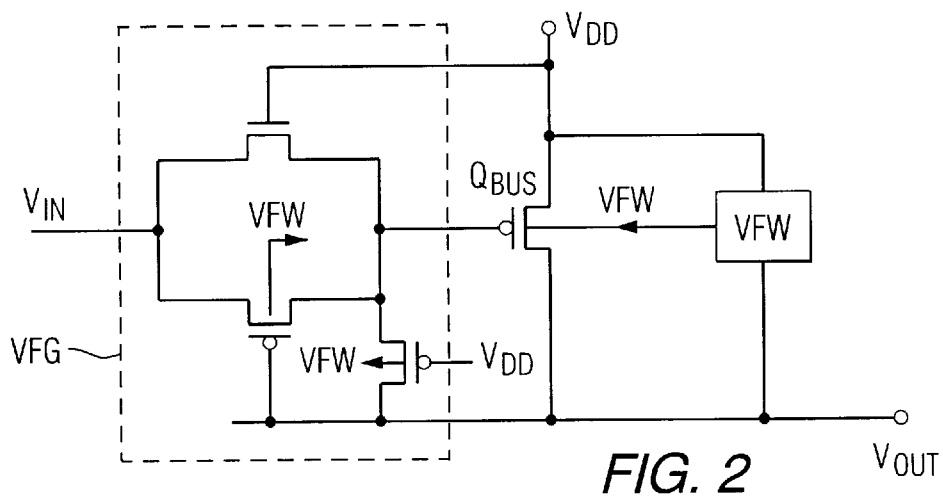
FIG. 2 is a schematic of a prior art bus driver circuit.
Figure 3:
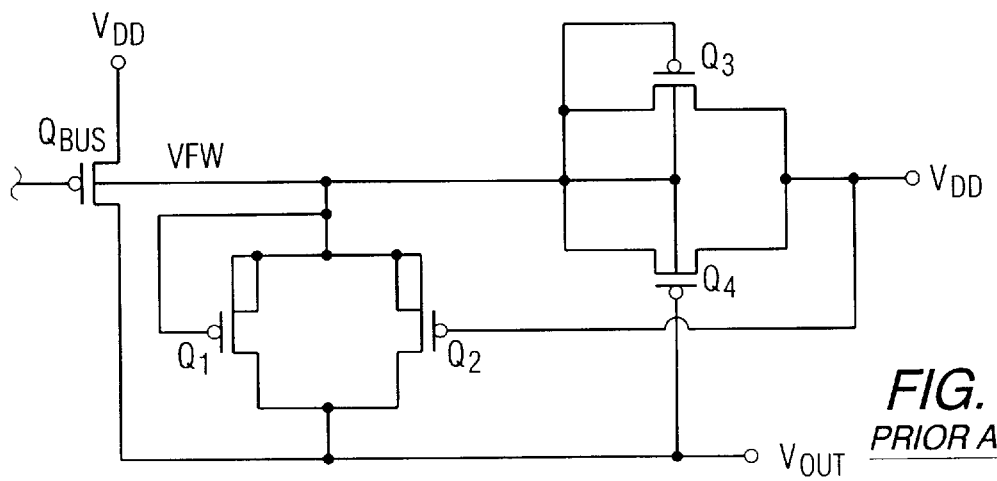
FIG. 3 is a further schematic of the floating gate circuit of FIG. 2.

The circuits shown in U.S. Pat. 5,160,855 and FIG. 2 include a floating gate voltage circuit (VFG) and a floating well voltage circuit (VFW). The VFG circuit is connected between the input $V_{IN}$ and the gate of the output transistor $Q_{BUS}$. The VFW circuit is connected between the output $V_{OUT}$ and the body tie of $Q_{BUS}$. During quiesence the input to VFG is tied to the supply voltage $V_{DD}$. As long as $V_{OUT}$ is less than $V_{DD}$ the gate voltage is tied to $V_{DD}$. The VFG monitors the output voltage and adjusts the gate voltage to follow the output voltage $V_{OUT}$ when $V_{OUT}$ is greater than $V_{DD}$. During transmission, the input of the floating gate circuit may vary between ground and the supply voltage to turn the drive transistor on and off, respectively. In this way, the gate and the drain of the transistor $Q_{BUS}$ are maintained at the same potential when $V_{OUT}$ rises above $V_{DD}$. Accordingly, the transistor $Q_{BUS}$ is prevented from turning on. Of course, the problem of a floating output voltage $V_{OUT}$ also affects the well of the output transistor $Q_{BUS}$. In the prior art solution as shown in FIG. 3, the VFW circuit attempts to adjust the voltages applied to the well of $Q_{OUT}$ in order to prevent unwanted operation. The prior art circuit functions acceptably for conditions when $V_{OUT}$ is significantly less than $V_{DD}$ and when $V_{OUT}$ is significantly greater than $V_{DD}$. However, it experiences problems when $V_{OUT}$ is approximately the same value as $V_{DD}$.

When $V_{OUT}$ is less than $V_{DD}$, transistor Q4 is on and VFW is effectively connected to $V_{DD}$. Accordingly, the diode in the body tie is reverse biased and does not conduct current. That is the condition for normal transmission. When the bus is off and there is no transmission, $V_{OUT}$ may rise to a voltage greater than $V_{DD}$. For example, $V_{DD}$ for a bus is normally 3.3v but elements and devices driven by the bus may be at 5v. Accordingly, $V_{OUT}$ may be much greater than $V_{DD}$. In that case, Q4 is off and Q1 and Q2 are on and VFW follows $V_{OUT}$. The same voltage of $V_{OUT}$ is applied across the body tie diode $D_2$. Since the same voltage is across both terminals of the body tie diode, the diode remains off.

However, the circuit shown in FIG. 3 does not control VFW when $V_{OUT}$ is close to $V_{DD}$. When $V_{OUT}$ is nearly the same as $V_{DD}$, all of the transistors Q1–Q4 are off. At that time, there is no control on VFW. Consequently the body becomes a high impedance node and is susceptible to charge injection through the drain to body capacitance during transmission. The injected charge changes the voltage on the body which then changes the threshold voltage on $Q_{BUS}$. Modulating the threshold voltage in such a way causes signal distortion.

Figure 4:
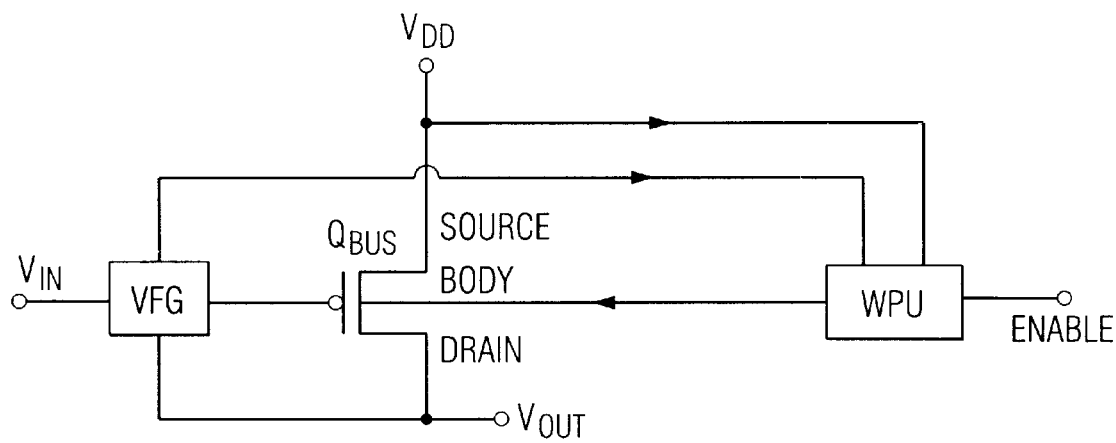
FIG. 4 is a schematic diagram of the invention having a well pull up circuit.
Figure 5:
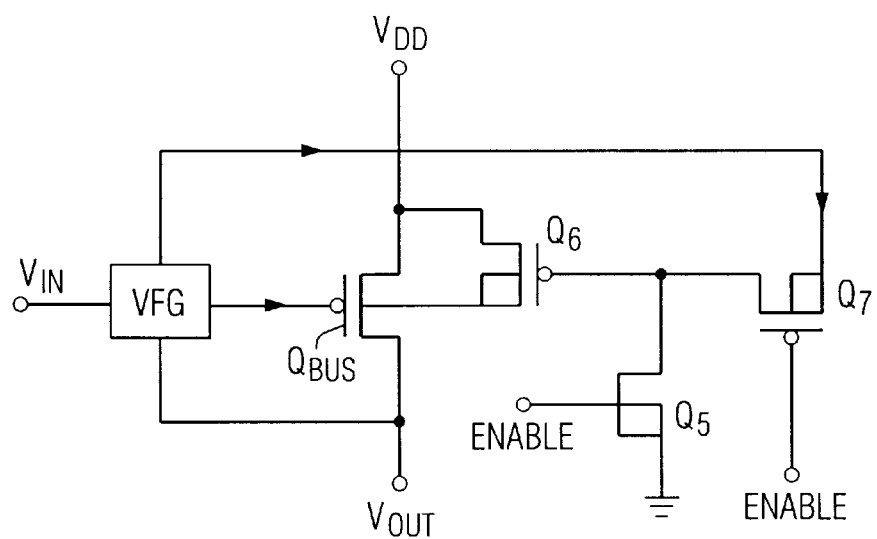
FIG. 5 is a more detailed schematic of the well pull up circuit.

Turning to FIGS. 4 and 5, the invention remedies this deficiency of prior art by adding a well pull up (WPU) circuit to the circuit of FIG. 3 and removing the VFW circuit. The WPU circuit (WPU) is connected to the body of $Q_{bus}$, the output of the VFG circuit, and to $V_{DD}$. It receives an input enable signal that is derived from one or more of the enable signals that turn on the bus. In operation, the well pull up circuit ensures that the body of the output transistor $Q_{BUS}$ is tied to $V_{DD}$ when the bus is enabled. At all other times, the well pull up circuit allows the body of $Q_{BUS}$ to float electrically so that the drain diode of $Q_{BUS}$ can not conduct current.

With reference to FIG. 5, when the enable signal is high, Q5 is on which turns on Q6. Accordingly, $V_{DD}$ is connected to VFW through Q6 and $V_{DD}$ is applied to the body of $Q_{BUS}$. During transmission the supply voltage $V_{DD}$ is connected to one end of diode $D_2$ and, since $V_{OUT}$ is less than $V_{DD}$ during transmission the diode is reverse biased and does not conduct. When enable is low and the bus is quiescent, Q5 and Q6 are off while Q7 is turned on. Q7 connects the VFG node to the gate of Q6. This is necessary to keep Q6 off when $V_{OUT}$ is backwards driven above $V_{DD}$. Thus, when the circuit is not enabled, the body of $Q_{BUS}$ is allowed to float and can not carry current.

In summary, during operation, when ENABLE is high, Q5 and Q6 are on and so VFW is coupled to $V_{DD}$. This prevents the body diode from floating during transmission and precludes signal distortion due to charge injection into the body. ENABLE is high when the output stage is driving a load. In order to disable the output stage and create a high impedance state, $V_{IN}$ is set high, i.e., to $V_{DD}$ and ENABLE is set low, i.e., to zero volts. This turns off Q5 and turns on Q7. The voltage VFG is used to turn off Q6. VFG, by design, will be greater than or equal to $V_{IN}$. With Q6 off, the body of the output PMOS $Q_{BUS}$ device is allowed to float so that it cannot conduct current.

Figure 6:
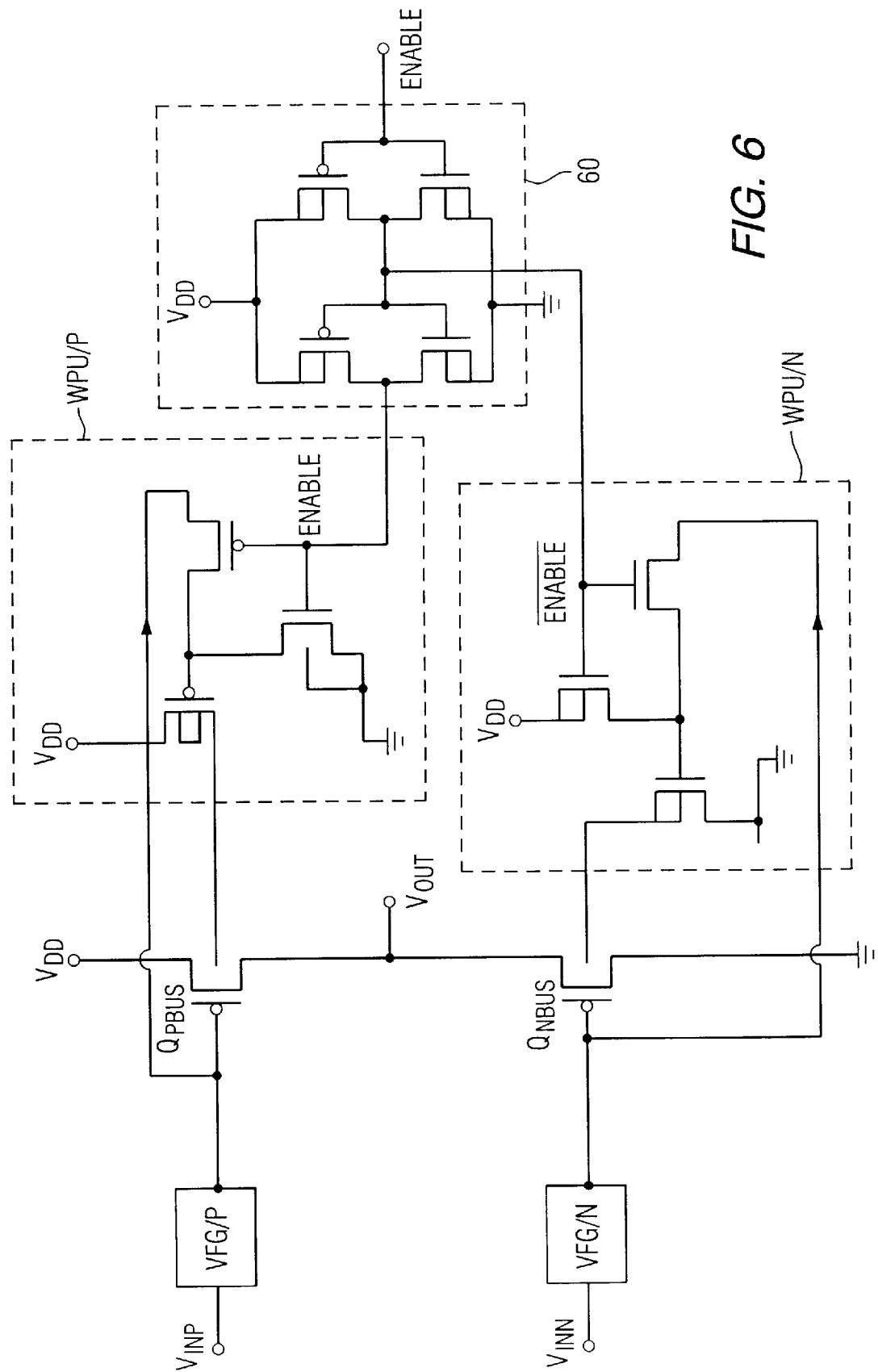
FIG. 6 is a schematic of a CMOS output driver that applies the invention to the NMOS and PMOS transistors.

With reference to FIG. 6, a CMOS output driver is shown. The embodiment includes two output transistors, $Q_{PBUS}$ and $Q_{NBUS}$. The transistors are connected in series with $Q_{PBUS}$ connected to $V_{DD}$ and $Q_{NBUS}$ connected to ground. The output voltage $V_{OUT}$ is taken from the series connection of the transistors $Q_{PBUS}$ and $Q_{NBUS}$. The voltage on the gate of $Q_{PBUS}$ is monitored and controlled by a floating gate circuit, VFG/P. A corresponding floating gate circuit, VFG/N controls the voltage on the gate of $Q_{NBUS}$. The voltage on the well of $Q_{PRUS}$ is controlled by the well pull up circuit WPU/P. In a similar manner, the voltage on the well of $Q_{NBUS}$ is controlled by another well pull up circuit, WPU/N. An enable control circuit 60 is coupled to WPU/P and to WPU/N. The enable control circuit 60 applies the enable signal to WPU/P and applies the signal enable bar to WPU/N. The operation of WPU/P and WPU/N of FIG. 6 substantially corresponds to the operation of the WPU circuit shown in FIGS. 4 and 5. Those skilled in the art understand that the NMOS transistor may be connected to ground or to a negative power supply. Function and operation of CMOS output drivers is otherwise generally well-known to those skilled in the art.

As mentioned in the Background, conventional floating gate circuits have problems. For example, they are prone to fail at high speeds. The transistor QBUS is a relatively larger transistor when compared to the logic and other transistors shown in FIGS. 1–4. Such large transistors accumulate charge on their gates and that charge must be removed before the transistor QBUS can turn off. Conventional floating gate circuits are slow to remove the charge on the gates of the output power mosfets, such as QBUS. As such, the transistor may remain on for a period of time when it is suppose to be off. Downstream equipment that relies upon the status of the output of QBUS may read the output as high when the transistor is trying to turn off but has not yet discharged its gate. The invention shown if FIGS. 7–11 overcomes the limitations of the prior art.

VFGN circuits 20 and 20.1 block leakage current when the ENABLE signal is LO and the driver circuit is in tristate or quiescent mode. When ENABLE is HI, the VFG circuit is essentially transparent. With reference to FIG. 7, one embodiment for the NMOS floating gate circuit is shown. The VFGN circuit 20 controls the voltage on the QNBUS.

When the driver circuit is enabled, a LO signal on Vinn will correspond to a LO signal on at the output, $V_{out}$. The VFGN circuit 20 includes an inverter circuit with PMOS transistor 21 and NMOS transistor 23. The PMOS transistor 21 is coupled to the supply $V_{dd}$; the NMOS transistor 23 is coupled to ground. A control NMOS transistor 22 is coupled to the drain of transistor 23 and to the drain of transistor 21. The control transistor 22 has its gate coupled to a first or N-control signal from the well pull up circuit. The circuit 20.1 of FIG. 8a is shows circuit 20.1 that is similar in function and operation to circuit 20. Circuit 20.1 includes a current source 24, which can be in addition to transistor 21 or entirely replacing transistor 21. The current source 24 provides controlled current to charge the gate of output transistor 70 and thereby slow down or control the turn on rate of that transistor. FIG. 8b shows circuit 20.2 without the current shutoff PMOS transistor 21.

As shown in FIG. 9, the VFGP circuit 30 includes an inverter circuit with NMOS transistor 31 and PMOS transistor 33. The NMOS transistor 31 is coupled to ground; the PMOS transistor 33 is coupled to $V_{dd}$. A control PMOS transistor 32 is coupled to the drains of transistors 33 and 31. The control transistor 32 has its gate coupled to a second or P-control signal from the well pull up circuit WPU/P as shown on FIG. 11. FIG. 10a shows another VFPR circuit 30.1 with a current source 34 and a shutoff transistor 31. FIG. 10b shows a further circuit 30.2 without shutoff transistor 31.

The invention improves performance of the driver in its enabled state. In its positive state Vinn turns on transistor 23, as shown in FIG. 7, and current is not impeded by transistor 22, and the QNBus output voltage drop quickly and shut off the driver transistor 70, shown in FIG. 11. Prior art circuits could not shut off transistor 70 fast enough to prevent large shoot-through switching currents through transistors 60 and 70 during high speed output switching. An example of this limitation can be shown in the circuit of FIG. 2. It is too slow and often will not shut off the drive transistor, especially at high speeds. These are speeds at or above 200 KBPS.

Those skilled in the art will recognize that an inverter consisting of transistors 21 and 23 could be used to drive the gate of output transistor 70. However, such a two-transistor circuit would malfunction. In the tristate mode transistor 23 would leak current back into the driver circuit, causing the gate to be voltage clamped slightly below ground. If the output were back-driven slightly further negative, the driver transistor would eventually be turned on, conducting large currents backwards, that is from ground back out to the output. The invention prevents such current leakage from occurring by inserting transistor 22 between transistors 21 and 23 and by connecting transistor 22 in an unusual and unconventional manner. Transistor 22 has its well connected to its "drain". That is counter to normal practice of shorting a well to the source. The unique connection of transistor 22 will allow the parasitic diode of the transistor to become forward biased harmlessly in enabled operation and it serves as a diode block in the quiescent or high-impedance state. Such a structure is contrary to accepted design rules for transistors. The VFG circuit also improves conventional operation by rapidly turning off the driver transistor 70.

Turning to FIG. 11, there is a full driver circuit with VFGN and VFGP circuits as described above. Well pull up circuits 68, 78 generate a control signals N control and P control, respectively. Let us assume we wish to have a LO output at Vout, so that Vinn is LO. For the present we can ignore Vinp. When the ENABLE signal is HI, transistor 72 is on and transistor 73 is off. As such, Vdd is coupled via the signal line Ncontrol to the gate of transistor 22. That turns on the transistor 22 which remains on as long as ENABLE is HI. With transistor 22 on, it is virtually transparent to changes in Vinn. Since transistor 22 is turned fully on, its low on-resistance is in parallel with the forward-biased parasitic diode, and there is no voltage drop associated with the diode at this point. When Vinn is LO, transistor 21 is on and transistor 23 is off. The well of transistor 22 is connected on the "wrong" or drain side. That puts the transistor's parasitic diode in parallel with the transistor 22 (which is on anyway). But that does not matter so long as the transistor 23 is off. When Vinn goes HI, the driver circuit begins turning off the output transistor 70. With Vinn HI, transistor 21 turns off and transistor 23 turns on. Current from the gate of output driver 70 conducts through transistors 22 and 23 to ground. If transistor 22 were not already on and provided with its "wrong" connections, then the current from the gate would take a long time to overcome the diode formed by the well and the source of transistor 22. However, since the gate (N-control) is on, i.e., much higher than the source and drain voltages, the FET conducts readily and the gate current from transistor 70 rapidly discharges through transistor 22 and 23. Since 22 is on, it presents, at most, a very low resistance to current discharging from the gate of transistor 70. So long as the circuit 10 in enabled, the VFG circuit behaves like an inverter and transistor 22 is effectively transparent.

The unique connection of the transistor 22 lets the circuit rapidly remove a lot of current from the gate of transistor 70. Even thought transistor 22 is on it has no effect on the output of the driver.

When the ENABLE signal is LO the circuit 10 is in its tristate of quiescent mode. N-control connects the drain, gate and well of transistor 22 to the same voltage at node 75. With these three terminals of the NFET connected together, the transistor can never turn on if the drain, gate and well node is driven negative with respect to the source. As such, no current can leak through transistor 23 because no current passes transistor 22 when ENABLE is LO. More specifically, when ENABLE is LO, transistor 72 is off and transistor 73 is on. Node 75 is coupled to N-control and node 75 is to the gate of transistor 70 through transistor 73. The signal N-control is coupled to the gate of transistor 22. The gate of transistor 70 is coupled to the source and well of transistor 22. Since the same voltage is coupled to the source, gate and well of transistor 22, that transistor cannot turn on whenever the voltage appearing at Vout is negative. However, if transistor 22 was removed, then transistor 23 could be affected by the voltage on Vout and could turn on and leak ground current to the driver transistor's gate. Also, if the transistor had its well connected to its drain in a conventional manner, leakage current would simply pass through the forward biased parasitic diodes of transistor 22 and transistor 23 and again voltage clamp the gate of transistor 70 so that transistor 70 would conduct backwards if the output voltage was back-driven further negative.

What is claimed is:

1. An output driver circuit having a transmitting state for driving an output terminal in accordance with an input signal and a quiescent state, comprising:

a first output MOS transistor having a source, an insulated gate, a body and a drain;

a supply terminal connected to the source of the first output MOS transistor;

a gate terminal connected to the insulated gate of the first output MOS transistor;

an output terminal connected to the drain of the first output MOS transistor for generating an output voltage in response to an input voltage on the gate of the first output MOS transistor;

a floating gate circuit coupled to the gate terminal for receiving an input signal, said floating gate circuit comprising a two transistor inverter and a third, control transistor disposed between the inverter transistors, with the well of the third transistor coupled to its drain; and a well pull up circuit connected to the gate termninal, said well pull up circuit generating a first signal while the driver circuit is enabled for keeping the third transistor on during enabled operation and a second signal when the driver circuit is not enabled for connecting together enough of the terminals of the third transistor to keep the third transistor off.

2. The output driver of claim 1, wherein the well pull up circuit is connected to the body of the first output MOS transistor and to the supply terminal for connecting the supply to the well of the first output MOS transistor during transmission and thereby preventing the modulation of the body voltage by charge injection during transmission and for floating the body of the output transistor during quiescence.

3. The output driver of claim 1, wherein the floating gate circuit further comprises a current source for controlling the slew rate of the driver transistor.

4. The output driver of claim 1, wherein the third transistor of the floating gate circuit is transparent to operation when the driver is enabled.

5. The output driver of claim 1, wherein the third transistor of the floating gate circuit is always on when the driver is enabled and is always off when the output driver is not enabled.

6. An output driver circuit having a transmitting state for driving an output terminal in accordance with an input signal and a quiescent state, comprising:

a first output MOS transistor having a source, an insulated gate, a body and a drain;

a supply terminal connected to the source of the first output MOS transistor;

a gate terminal connected to the insulated gate of the first output MOS transistor;

an output terminal connected to the drain of the first output MOS transistor for generating an output voltage in response to an input voltage on the gate of the first output MOS transistor;

a floating gate circuit coupled to the gate terminal for receiving an input signal, said floating gate circuit comprising a current source, a transistor witch and a third, control transistor disposed between the current source and the transistor switch, with the well of the third transistor coupled to its drain; and a well pull up circuit connected to the gate terminal, said well pull up circuit generating a first signal while the driver circuit is enabled for keeping the third transistor on during enabled operation and a second signal when the driver circuit is not enabled for connecting together enough of the terminals of the third transistor to keep the third transistor off.

* * * * *